United States Patent [19]
Ma

[11] Patent Number: 5,885,864
[45] Date of Patent: Mar. 23, 1999

[54] METHOD FOR FORMING COMPACT MEMORY CELL USING VERTICAL DEVICES

[75] Inventor: Manny Ma, Boise, Id.

[73] Assignee: Micron Technology, Inc., Boise, Id.

[21] Appl. No.: 736,105

[22] Filed: Oct. 24, 1996

[51] Int. Cl.⁶ .................................................. H01L 21/8242
[52] U.S. Cl. ........................ 438/253; 438/254; 438/268
[58] Field of Search .................... 438/206, 209, 438/210, 253–254, 268–278, 329, 396

[56] References Cited

U.S. PATENT DOCUMENTS

| | | | |
|---|---|---|---|
| 4,670,768 | 6/1987 | Sunami et al. ............................. | 357/42 |
| 5,087,581 | 2/1992 | Rodder ...................................... | 437/41 |
| 5,106,775 | 4/1992 | Kaga et al. . | |
| 5,162,248 | 11/1992 | Dennison et al. ......................... | 437/52 |
| 5,192,704 | 3/1993 | McDavid et al. ......................... | 437/52 |
| 5,403,763 | 4/1995 | Yamazaki .................................. | 437/44 |
| 5,589,411 | 12/1996 | Yang et al. ................................ | 437/41 |
| 5,598,037 | 1/1997 | Kikuchi et al. ........................... | 257/773 |

OTHER PUBLICATIONS

IEEE Transactions on Electron Devices, vol. 39, No. 8, Aug. 1992 pp. 1876–1881 –"Numerical Analysis of a Cylindrical Thin–Pillar Transistor (CYNTHIA)".

*Primary Examiner*—Jey Tsai

[57] ABSTRACT

An exemplary embodiment of the present invention includes a memory cell in a semiconductor device, comprising a substantially vertical-gated, access transistor having its gate electrode surrounding a pillar portion of a silicon material, a first source/drain electrode in an upper portion of the pillar portion and a second source/drain electrode in a silicon material extending substantially horizontally about the base of the pillar portion; and a storage capacitor having its storage electrode connecting to the first source/drain electrode. The structure of the storage capacitor may configured as desired which includes a stacked capacitor structure or a cylindrical capacitor structure.

4 Claims, 5 Drawing Sheets

METHOD FOR FORMING COMPACT MEMORY CELL USING VERTICAL DEVICES

FIELD OF THE INVENTION

This invention relates to semiconductor devices and more particularly to the utilization of a vertical access device in an interconnecting network and in a storage cell.

BACKGROUND OF THE INVENTION

Dynamic semiconductor memory storage devices it is essential that storage node capacitor cell plates be large enough to retain an adequate is charge or capacitance in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of dynamic random access memory (DRAM) arrays continues to increase for future generations of memory devices.

The ability to densely pack storage cells, while maintaining required capacitance levels, is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A variation of the above stacked capacitor structure is a stacked container (or cylindrical) cell, as disclosed in U.S. Pat. No. 5,162,248, which is hereby incorporated by reference. The container cell helps reduce the surface area required to obtain the necessary capacitance for a densely packed memory array. The size reduction of the memory cell is now, however, limited by the size of the access transistor.

In a paper entitled "Numerical Analysis of a Cylindrical Thin-Pillar Transistor (CYNTHIA)," by Miyano et al., published in IEEE TRANSACTIONS ON ELECTRON DEVICES, VOL. 39, NO. 8, August 1992, a cylindrical thin-pillar transistor is disclosed. This structure forms an n-channel transistor with a cylindrical gate electrode around a p-type silicon pillar.

The present invention takes the concept of Miyano et al. much further by utilizing a cylindrical pillar transistor structure to construct a memory cell for memory devices and by constructing an interconnecting structure for semiconductor devices in general. The advantages of the present invention will come to light from the exemplary embodiments included in the following disclosure.

SUMMARY OF THE INVENTION

In one exemplary implementation of the present invention includes the use of a vertical active device which is used as an interconnection structure for a semiconductor device. In a second exemplary implementation, a vertical active device is utilized to build a memory cell structure in a semiconductor memory device.

One preferred implementation includes a memory cell in a semiconductor device, comprising a transistor having its gate electrode surrounding an island of silicon material, a first difflusion region in an upper portion of the island and a second diffusion region in a silicon material about the base of the island; and a capacitor having one of its electrodes connecting to the first diffusion region. The capacitor may include various capacitor structure configurations, including a stacked capacitor structure or a cylindrical capacitor structure.

A second preferred implementation to form the above memory cell includes the steps of forming a vertical access device; of forming a first capacitor electrode making contact to a diffusion region of the vertical access device; of forming a capacitor dielectric over the first capacitor electrode; and of forming a second capacitor electrode over the capacitor dielectric.

A third preferred implementation of the present invention includes an interconnection network to a plurality of transistors in a semiconductor device, comprising a first diffusion line residing in a silicon material and connecting to a first diffusion region of each transistor in the plurality of transistors; and a conductive line connecting to each gate electrode of the each transistor.

A fourth preferred implementation to form the interconnection network includes the steps of forming a conductively implanted diffusion line in a silicon material connecting to a first diffusion region of each transistor, of a plurality of transistors; and of forming a second conductive line connecting to each gate electrode of each transistor.

DETAILED DESCRIPTION OF THE INVENTION

Exemplary embodiments of the present invention are depicted in FIGS. 1 through 8. These exemplary embodiments will be appreciated by one skilled in the art, as taught from the following descriptions of the invention.

Figure 1:
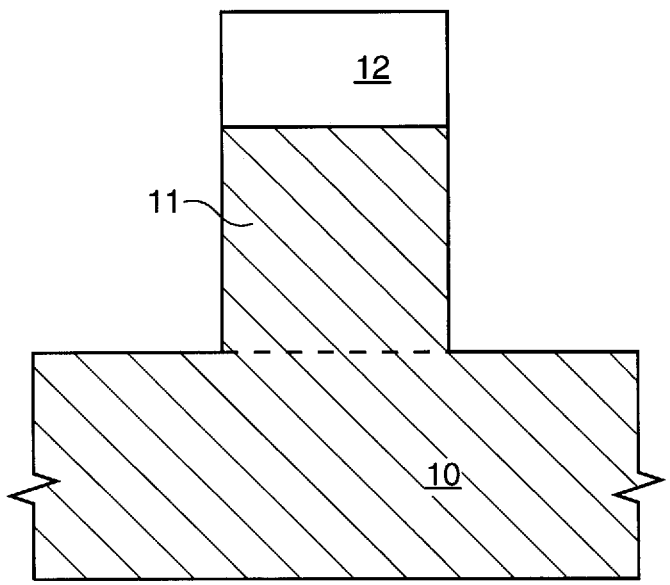
FIG. 1 depicts an in-process wafer assembly, after photolithography and etching steps have been performed to form a columnar silicon substrate portion, illustrated in vertical section.

Referring now to FIG. 1, an in-process wafer assembly has been patterned and etched. Silicon substrate 10 has been subjected to a photolithography step to pattern photoresist mask 12. A subsequent etch step forms cylindrical silicon pillar (or columnar silicon portion) 11, as illustrated in the vertical cross-section.

Figure 2:
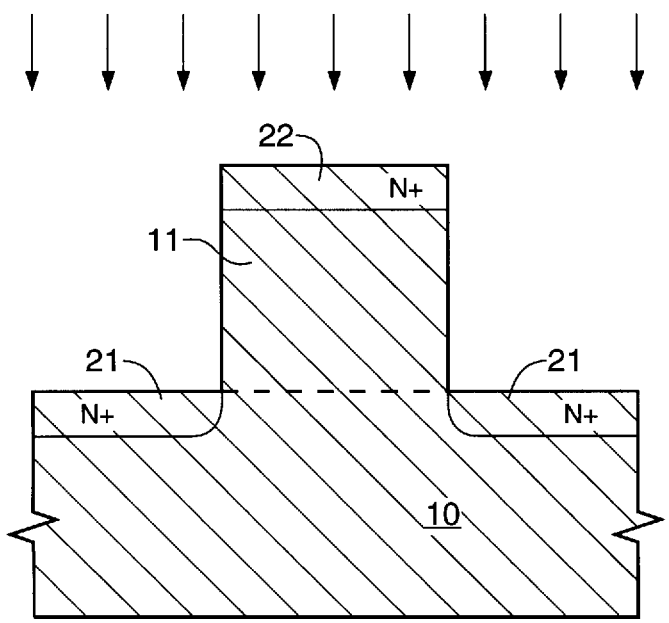
FIG. 2 depicts the in-process wafer assembly of FIG. 1, following a photoresist mask strip and a conductive impurity implant.

Referring now to FIG. 2, following a photoresist mask 12, a conductive impurity implant is performed to form diffusion region 21, in silicon substrate 10, that surrounds columnar silicon portion 11. This implant also forms diffusion region 22, which penetrates into the surface region of columnar silicon portion 11.

Figure 3:
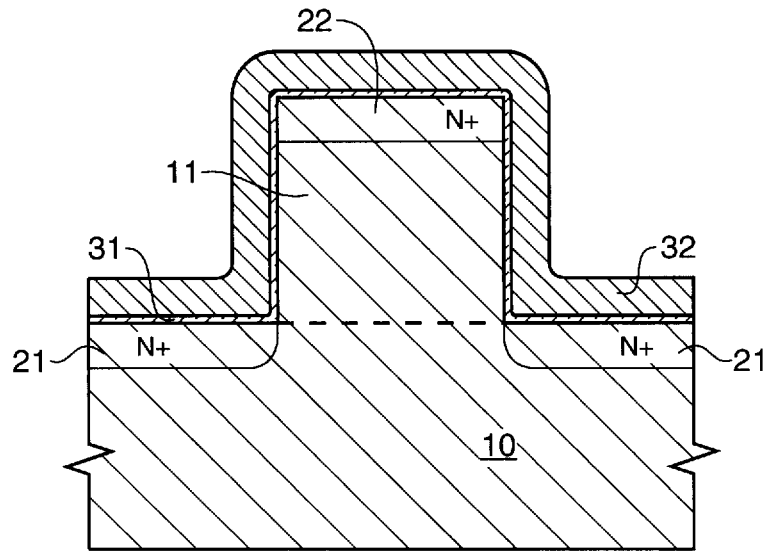
FIG. 3 depicts the in-process wafer assembly of FIG. 2, after a deposition of a thin gate oxide layer followed by a deposition of a polysilicon layer.

Referring now to FIG. 3, a thin gate oxide layer 31 is formed over diffusion regions 21, the substantially vertical sidewall of columnar silicon portion 11, and over diffusion region 22. A conformal polysilicon layer 32 is then formed over thin gate oxide layer 31.

Figure 4:
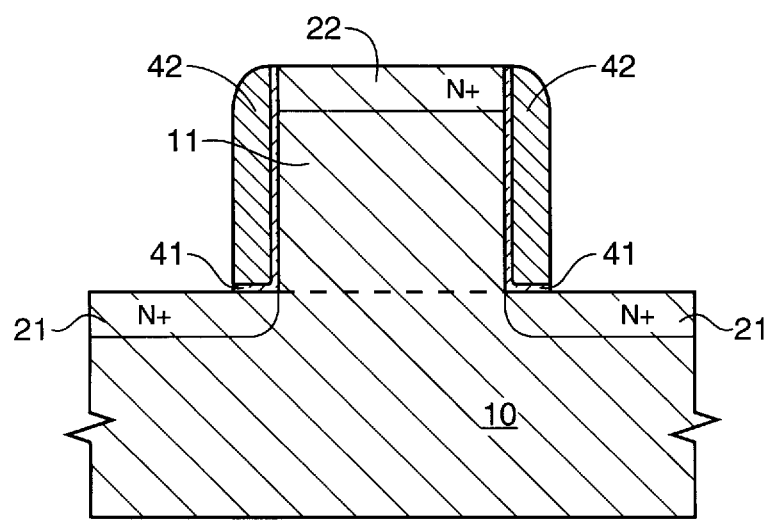
FIG. 4 depicts the in-process wafer assembly of FIG. 3, after an anisotropic etch is performed to a form vertical polysilicon spacer adjacent the thin gate oxide layer, which in turn is adjacent the columnar silicon substrate portion.

Referring now to FIG. 4, an anisotropic etch is performed to form cylindrical vertical polysilicon spacer 42, which is adjacent the remaining thin gate oxide layer 41. Thin gate oxide layer 41, in turn, is adjacent the substantially vertical sidewall of columnar silicon portion 11. This configuration forms a cylindrical (or columnar) vertical field effect transistor (VFET). Diffusion region 21 forms a first source/drain region, while diffusion region 22 forms a second source/drain region to the VFET. Cylindrical polysilicon spacer 42 forms the gate to the VFET, while gate oxide layer 41 provides the insulation between spacer 42 and a channel region extending from diffusion region 21 to diffusion region 22, within columnar silicon portion 11.

Figure 5:
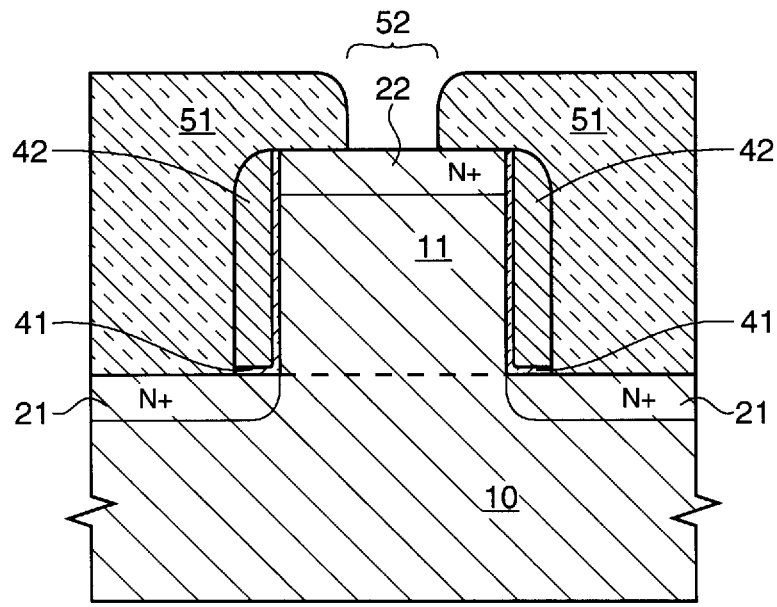
FIG. 5 depicts the in-process wafer assembly of FIG. 4, after a thick, planarized insulating layer, having an access hole therein, is formed.

Referring now to FIG. 5, a thick insulating layer 51 is formed over the existing wafer assembly and then planarized. Insulating layer 15 is patterned and etched to form access hole 52 to underlying diffusion region 22.

Figure 6:
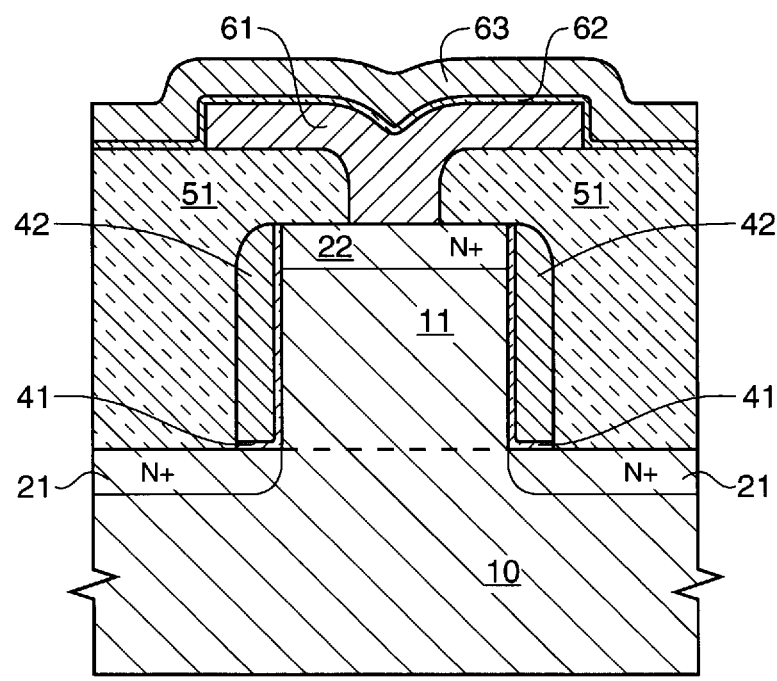
FIG. 6 depicts the in-process wafer assembly of FIG. 5, after a storage capacitor plate, capacitor dielectric and a top capacitor plate are formed.
Figure 7:
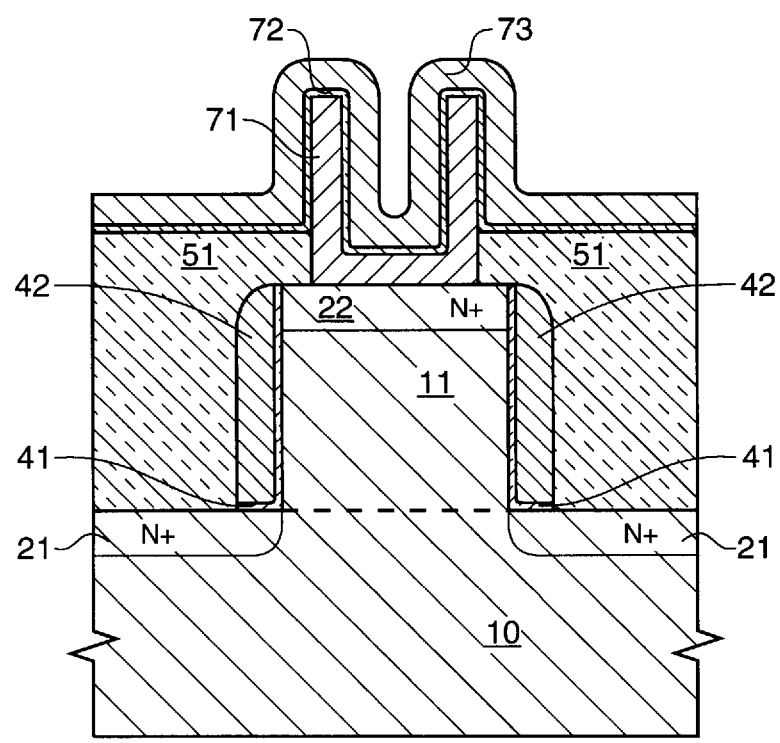
FIG. 7 depicts an in-process wafer assembly of FIG. 5, after a cylindrical storage capacitor plate, capacitor dielectric and a top capacitor plate are formed.

Referring now to FIG. 6, a storage capacitor plate 61 is formed by first forming a conductively doped polysilicon layer that is patterned and etched to the desired shape. A conformal storage capacitor dielectric 62 is formed over storage capacitor electrode 61 and the exposed regions of planarized insulating layer 51. Next, a top capacitor plate 63, is formed over capacitor dielectric layer 62 to complete the memory cell device consisting of the VFET, as described above and the storage capacitor, which was just constructed.

The shape of the storage capacitor plate may be constructed into any compatible structure. For example, in FIG. 7, a cylindrical storage capacitor plate 71 may be formed, followed by the formation of capacitor dielectric 72 and top capacitor plate 73.

Figure 8:
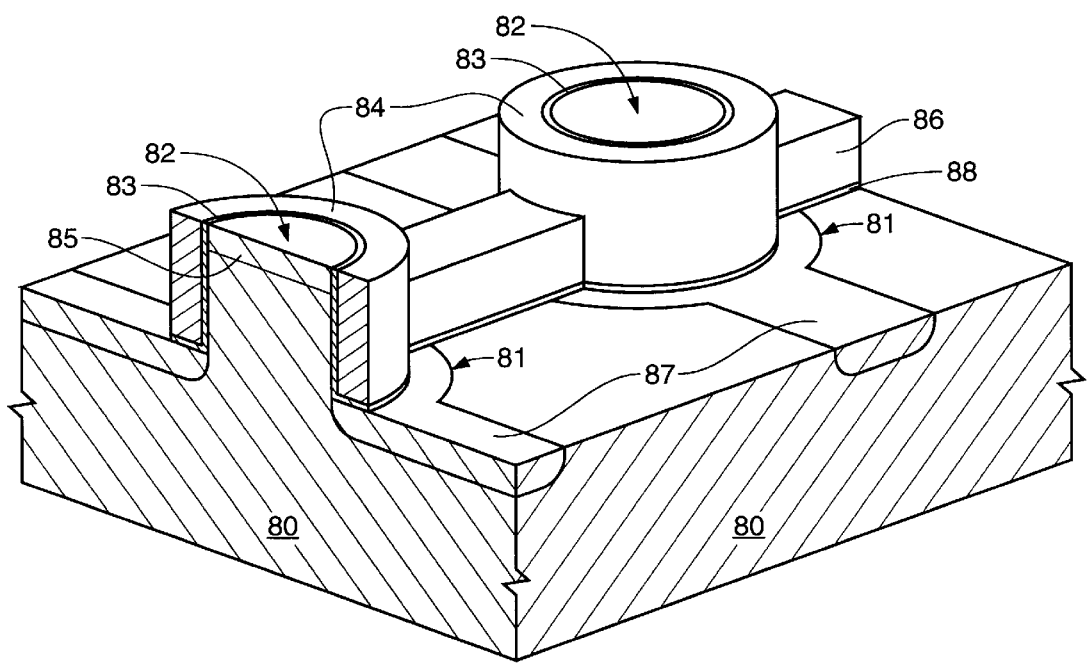
FIG. 8 depicts a three dimensional view of an interconnecting network of vertical access devices.

In a second exemplary embodiment and referring now to FIG. 8, a three dimensional view of an interconnecting network utilizing vertical access devices is shown. An in-process wafer assembly has been patterned and etched so that silicon substrate 80 has been subjected to a photolithography step to form a plurality of cylindrical silicon pillars (or columnar silicon portions) 82. A conductive impurity implant (an n-type impurity is preferred, though n or p-type may be used) is performed to form diffusion regions 81 (in the silicon substrate 80) and diffusion regions 85 (in columnar silicon portions 82). The diffusion regions 81 surround columnar silicon portions 82 and each diffusion region 81 extends to form a conductive line to the next columnar silicon portion (not shown) in that line (line 87). A practical application would be for each extending diffusion line 87, to serve as a digit line in a memory array.

A thin gate oxide 83 has been formed over diffusion regions 81, and over the substantially vertical sidewall of each columnar silicon portion 85. Next, a conformal polysilicon layer is formed over thin gate oxide 83 and then planarized to re-expose columnar silicon portions 82. The remaining conformal polysilicon layer and the underlying gate oxide 83 are patterned and etched to form cylindrical vertical polysilicon spacers 84 (which are adjacent each remaining thin gate oxide 83) and conductive polysilicon lines 86. A portion of thin gate oxide 83, remains adjacent the substantially vertical sidewall of columnar silicon portions 82. As mentioned, during the formation of cylindrical polysilicon spacers 84, the conformal polysilicon layer is also patterned and etched such that it also extends to each cylindrical polysilicon spacer 84 in that row to form conductive line 86. A practical application of this embodiment would be for each extending line 86 to serve as a word line in a memory array.

The configuration of the interconnecting network, described above, forms an array of cylindrical (or columnar) vertical field effect transistors (VFET) interconnected to one another. Diffusion regions 81 form a first source/drain region of each VFET, while diffusion regions 85 form a second source/drain region of each VFET. Cylindrical polysilicon spacers 84 form the gate to each VFET, while gate oxide 83 provides the insulation between spacers 84 and a channel region extending from diffusion region 81 to diffusion region 85, within columnar silicon portion 82 of each VFET. Gate oxide 83 is also patterned during the formation of conductive line 86 in order to insulate conductive line 86 from underlying substrate 80. Such a configuration would be advantageous when utilized in an array of access devices for a memory array, with the addition of the storage capacitors as described in FIGS. 5–7.

It is to be understood that although the present invention has been described with reference to preferred embodiments, various modifications, known to those skilled in the art, may be made without departing from the invention as recited in the several claims appended hereto.

What is claimed is:

1. A method for forming a memory cell in a semiconductor device, said method comprising the steps of:

simultaneously forming a columnar portion of silicon material and a perpendicular portion of silicon material extending therefrom from a continuous section of a silicon substrate;

implanting conductive dopants into a surface of said silicon material to form a first diffusion region in an upper surface of said columnar portion and a second diffusion region in a surface of said perpendicular portion about a base of said columnar portion;

forming a conductive spacer about said columnar portion which is insulated from said columnar portion and said second diffusion region by a dielectric layer;

forming an insulative layer about said first and second diffusion regions and conductive spacer, said insulative layer having a cavity therein to expose a major portion of said first diffusion region;

forming a first capacitor electrode making contact to said first diffusion region, said first capacitor electrode being a cylindrical-shaped container electrode;

forming a capacitor dielectric over said first capacitor electrode; and forming a second capacitor electrode over said capacitor dielectric.

2. The method of claim 1, wherein said step of forming said second diffusion region further comprises forming a metal silicided surface thereon.

3. A method for forming a memory cell in a semiconductor device, said method comprising the steps of:

simultaneously forming a columnar portion of silicon material and a perpendicular portion of silicon material extending therefrom from a continuous section of a silicon substrate;

forming an access transistor having its gate electrode surrounding said columnar portion of silicon material, a first source/drain electrode in an upper portion of said columnar portion and a second source/drain electrode in said perpendicular portion of silicon material that extends outwardly from a base of said columnar portion; and forming a storage capacitor having its storage electrode connecting to said first source/drain electrode, said storage electrode being a cylindrical-shaped container electrode.

4. The method of claim 3, wherein said step of forming said second source/drain electrode further comprises forming a metal silicided surface thereon.

* * * * *